United States Patent
Jain

(10) Patent No.: US 7,687,372 B2
(45) Date of Patent: Mar. 30, 2010

(54) SYSTEM AND METHOD FOR MANUFACTURING THICK AND THIN FILM DEVICES USING A DONEE LAYER CLEAVED FROM A CRYSTALLINE DONOR

(75) Inventor: Ajaykumar R. Jain, San Carlos, CA (US)

(73) Assignee: Versatilis LLC, Shelburne, VT (US)

( * ) Notice: Subject to any disclaimer, the term of this patent is extended or adjusted under 35 U.S.C. 154(b) by 1027 days.

(21) Appl. No.: 11/400,668

(22) Filed: Apr. 7, 2006

(65) Prior Publication Data

US 2006/0246267 A1 Nov. 2, 2006

Related U.S. Application Data

(60) Provisional application No. 60/669,240, filed on Apr. 8, 2005.

(51) Int. Cl.
  *H01L 21/30* (2006.01)
(52) U.S. Cl. .................. 438/455; 438/458; 438/459
(58) Field of Classification Search .......... 438/455, 438/458, 459
See application file for complete search history.

(56) References Cited

U.S. PATENT DOCUMENTS

| 4,080,478 | A | | 3/1978 | Yamamoto et al. |
|---|---|---|---|---|
| 4,874,438 | A | | 10/1989 | Oshita et al. |
| 5,294,808 | A | | 3/1994 | Lo |
| 5,981,400 | A | | 11/1999 | Lo |
| 6,083,818 | A | | 7/2000 | Stumborg et al. |
| 6,086,673 | A | | 7/2000 | Molnar |
| 6,136,141 | A | * | 10/2000 | Glatfelter et al. .......... 156/380.9 |
| 6,190,937 | B1 | | 2/2001 | Nakagawa et al. |
| 6,199,748 | B1 | | 3/2001 | Zhu et al. |
| 6,204,079 | B1 | * | 3/2001 | Aspar et al. .................... 438/25 |
| 6,242,324 | B1 | | 6/2001 | Kub et al. |
| 6,255,198 | B1 | | 7/2001 | Linthicum et al. |
| 6,340,788 | B1 | | 1/2002 | King et al. |

(Continued)

FOREIGN PATENT DOCUMENTS

JP 06211596 8/1994

OTHER PUBLICATIONS

*Growth of Rare-Earth Monolayers On Synthetic Fluorine Mica*, F. Tsui, P.D. Han, C.P. Flynn; Physical Review B, The American Physical Society, vol. 47, No. 20, pp. 13648-13652, May 15, 1993.

(Continued)

*Primary Examiner*—Robert M Kunemund
*Assistant Examiner*—Matthew J Song
(74) *Attorney, Agent, or Firm*—Downs Rachlin Martin PLLC

(57) ABSTRACT

Various embodiments of fabricated crystalline-based structures for the electronics, optoelectronics and optics industries are disclosed. Each of these structures is created in part by cleaving a donee layer from a crystalline donor, such as a micaceous/lamellar mass comprising a plurality of lamelliform sheets separable from each other along relatively weak cleavage planes. Once cleaved, one or more of these lamelliform sheets become the donee layer. The donee layer may be used for a variety of purposes, including a crystalline layer for supporting heteroepitaxial growth of one or more semiconductor layers thereon, an insulating layer, a barrier layer, a planarizing layer and a platform for creating useful structures, among others.

33 Claims, 11 Drawing Sheets

U.S. PATENT DOCUMENTS

| | | |
|---|---|---|
| 6,346,253 B2 * | 2/2002 | Takaoka et al. ............. 424/400 |
| 6,372,356 B1 | 4/2002 | Thornton et al. |
| 6,391,799 B1 | 5/2002 | Di Cioccio |
| 6,406,795 B1 | 6/2002 | Hwang et al. |
| 6,420,283 B1 | 7/2002 | Ogawa et al. |
| 6,472,276 B1 | 10/2002 | Hilt et al. |
| 6,713,326 B2 | 3/2004 | Cheng et al. |
| 6,746,777 B1 | 6/2004 | Hwang |
| 7,364,989 B2 | 4/2008 | Tweet et al. |
| 2004/0192067 A1 | 9/2004 | Ghyselen et al. |
| 2005/0009227 A1 * | 1/2005 | Xiao et al. .................... 438/82 |

OTHER PUBLICATIONS

H.M. Manasevit, "A Survey of the Heteroepitaxial Growth of Semiconductor Films on Insulating Substrates," Journal of Crystal Growth, (22) 125-148 (1974).

G. W. Cullen, "The Preparation and Properties of Chemically Vapor Deposited Silicon on Sapphire and Spinel," Journal of Crystal Growth 9 (1971) 107-125.

* cited by examiner

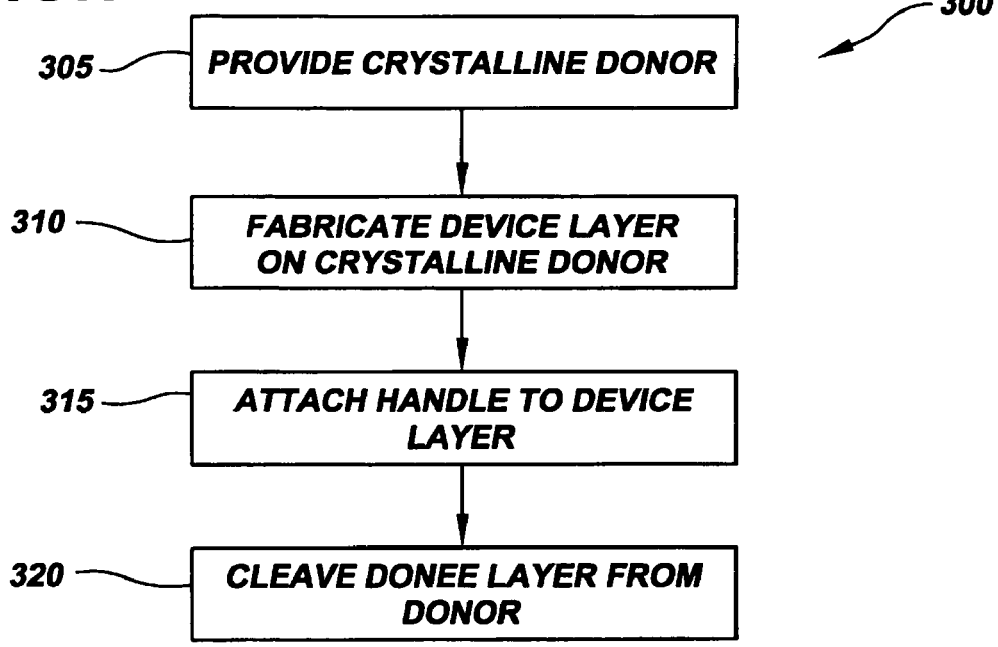
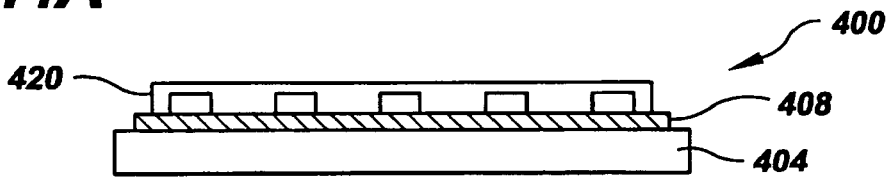
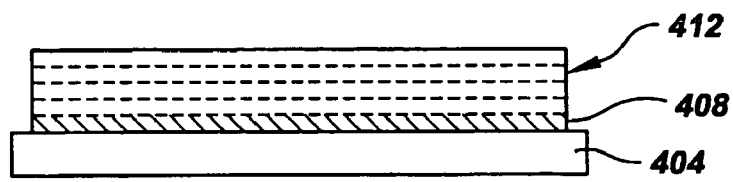
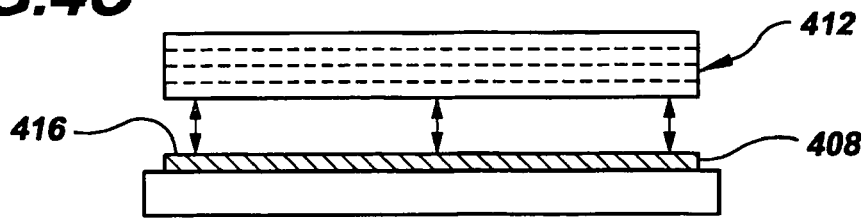

SYSTEM AND METHOD FOR MANUFACTURING THICK AND THIN FILM DEVICES USING A DONEE LAYER CLEAVED FROM A CRYSTALLINE DONOR

RELATED APPLICATION DATA

This application claims the benefit of priority of U.S. Provisional Patent Application Ser. No. 60/669,240, filed Apr. 8, 2005, and titled "Novel Method And Uses Of Transferred Thin Crystalline Films," that is incorporated by reference herein in its entirety.

FIELD OF THE INVENTION

The present invention generally relates to the field of film-based device manufacturing. In particular, the present invention is directed to a system and method for manufacturing thick and thin film devices using a donee layer cleaved from a crystalline donor.

BACKGROUND

There is an ever-present need and desire to reduce the size, weight and cost of electronic devices we use without sacrificing performance. A wide range of devices from displays, electronics, sensors and optical components, to name just a few, would benefit from methodologies that would produce ruggedized, lightweight, portable, small form factor, less power hungry and lower cost devices. Furthermore, new and novel markets and opportunities could be addressed and opened up if these devices could be made physically flexible and/or conformal.

To address these needs, previous approaches attempted to realize these devices by developing new, novel and expensive technologies. They have attempted to tailor the manufacturing process parameters such that flexible substrates polymer/plastic foil and metal foils may be used. However, polymers/plastics severely limit the maximum temperature a substrate may be exposed to during manufacturing. Metal foils, albeit immune from this temperature limit, suffer from a multitude of other problems that diminish device performance. This tailoring of manufacturing process parameters to suit the choice of substrate selection rather than device performance has resulted in less than ideal devices.

In addition to the desire to satisfy the needs just discussed, silicon on insulator (SOI) and other types of semiconductor material on insulator (SMOI) wafers are the subject of intense research and interest for next-generation technologies in the electronics industry. SMOI technology offers a host of benefits that are key enablers for next-generation technologies. SMOI wafers are useful for a large number of applications, such as:

- high-bandwidth electronics, e.g., memory, high-speed processors and servers, video conferencing systems, direct cinema distribution and display, etc.;
- low voltage, low power CMOS, e.g., portable computers, portable communications, notebooks, watches, PDAs, etc.;
- high voltage and high power devices, e.g., automotive controls, power switches, display and audio power supplies, etc.; and
- other applications, e.g., smart sensors and controls, MEMS, optoelectronics, radiation-hardened devices, smart power circuits and intrinsic gettering layers, among others.

Depending on the semiconductor layer thickness and insulator thickness SMOI technology may be further sectioned into categories, such as, thin-body CMOS, fully-depleted CMOS, partially-depleted CMOS, bipolar power, etc. Currently, the International Technology Roadmap for Semiconductors (www.itrs.net) predicts the need to have thin-body CMOS (silicon layer thickness less than 10 nm) by about the year 2011.

Moreover, SMOI substrates presently come in many different flavors, including, SOI with opaque substrate, germanium on insulator with opaque substrate, silicon on sapphire with transparent substrate and silicon-germanium on insulator with opaque substrate. The variants may be opaque or transparent to visible radiation. Some applications, such as backlit displays, micro-displays, head-mounted displays, etc., require transparent substrates for backlight to pass through. On the other hand, mainstream electronics usually utilize opaque substrates.

SMOI wafers need to have low surface roughness, low defect densities, low densities of pinholes in the insulator layer, high insulator breakdown field, low interface bubble density, low metallic contamination and low oxygen content in the semiconductor film layer. Furthermore, for more widespread industry acceptance, SMOI wafers need to significantly lower in cost and command only a small premium over conventional bulk silicon wafers. Unfortunately, most in-production SMOI techniques are too exotic and therefore too expensive to service the overall market segments where SMOI technology would otherwise be embraced.

SUMMARY OF THE DISCLOSURE

In one aspect, the present invention is directed to a method of making a device structure. The method comprises providing a crystalline donor having a first surface and a first cleavage plane substantially parallel to the first surface so as to define a first donee layer between the first surface and the first cleavage plane. At least one device is fabricated upon the first surface so that the device is monolithic with the first donee layer. The at least one device is any one of an electronic type, an optoelectronic type and an optic type. The first donee layer is cleaved from the crystalline donor so as to liberate the first donee layer from the crystalline donor.

In another aspect, the present invention is directed to a method of making a semiconductor base substrate for subsequent microelectronics fabrication thereon. The method comprises providing a micaceous/lamellar crystalline donor having a surface and a cleavage plane substantially parallel to the surface so as to define a donee layer between the surface and the cleavage plane. A heteroepitaxial layer is formed confronting the surface. The heteroepitaxial layer is configured for subsequent microelectronics fabrication thereon. The donee layer is cleaved from the micaceous/lamellar crystalline donor so as to liberate the donee layer from the micaceous/lamellar crystalline donor.

In a further aspect, the present invention is direct to a system for manufacturing electronic structures from at least one crystalline donor having a plurality of donee layers, wherein each of the electronic structures comprises a device layer. The system comprises a first roll for paying out an elongate handle. At least one crystalline donor located downstream of the first roll. The at least one crystalline donor contains a plurality of donee layers. A donee-layer affixer is operatively located downstream of the first roll and is operatively configured for affixing each of the plurality of donee layers to the elongate handle in succession with one another. A donee-layer cleaver is operatively located relative to the donee-layer affixer and is operatively configured to cleave each of the plurality of donee layers from the crystalline donor in succession with one another.

In yet another aspect, the present invention is directed to a device structure. The device structure comprises a first component layer comprising a first cleaved crystalline donee layer having a first cleaved surface and a second obverse cleaved surface spaced from the first cleaved surface. A first device layer, confronting the first cleaved surface, is formed monolithically with the first cleaved crystalline donee layer. The first device layer is at least one of an electronic type, an optoelectronic type and an optic type.

BRIEF DESCRIPTION OF THE DRAWINGS

For the purpose of illustrating the invention, the drawings include representations of one or more embodiments of the invention. However, it should be understood that the present invention is not limited to the precise arrangements and instrumentalities shown in the drawings, wherein:

FIG. 3 is a flow diagram presenting the method illustrated in FIGS. 2A-D;

FIG. 4A is a diagrammatic cross-sectional view of another device structure made using techniques of the present disclosure; FIGS. 4B-C are diagrammatic cross-sectional views illustrating various stages of the creation of the device structure of FIG. 4A;

DETAILED DESCRIPTION

A. Device Structures

Figure 1:
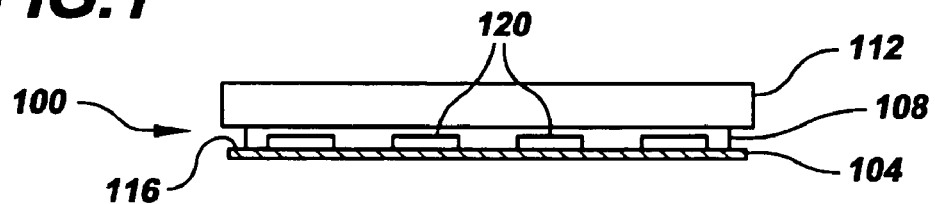
FIG. 1 is a diagrammatic cross-sectional view of a device structure made using techniques of the present disclosure.

Referring now to the drawings, FIG. 1 illustrates a device structure 100 made in accordance with the present disclosure. At a high level, device structure 100 comprises a crystalline "donee" layer 104, a "device" layer 108 and a "handle" 112. As discussed below in detail, donee layer 104 is a crystalline layer that has been cleaved from a crystalline "donor" (see donor 200 of FIG. 2A), which is essentially a mass of crystalline material that is able to provide at least one cleaved donee layer and, more typically, more than one donee layer. At its broadest, the present disclosure does not place any limitations on the donor other than it is crystalline in its atomic structure and that it may be cleaved so as to provide a crystalline surface, such as crystalline surface 116 suitable for use in creating a device structure, such as device structure 100. The donor may be virtually any naturally occurring mineral or synthetically produced crystal mass.

Two classes of donor masses currently used by the present inventor are the micaceous and lamellar classes in which a donor mass is made of a plurality of lamelliform sheets defined by relatively weak cleavage planes. The micaceous and lamellar classes are very similar to each other. The primary difference is that the micaceous class has a smaller crystal structure than the lamellar class. Since these classes are very similar, this disclosure and the claims appended hereto use the term "micaceous/lamellar" as a "super" class to express that both are virtually inseparable from one another in the context of the present disclosure. A partial listing of material suitable for the donor that provides donee layer 104 is provided in U.S. Provisional Patent Application Ser. No. 60/669,240, filed Apr. 8, 2005, and titled "Novel Method And Uses Of Transferred Thin Crystalline Films," (hereinafter, "the '240 application") that is incorporated herein by reference in its entirety as if originally disclosed in the present disclosure.

Device layer 108 may include one or more electronic, optoelectronic and/or optical devices 120 of virtually any known or hereinafter-developed sort, e.g., diodes, transistors, electroluminescent devices, and energy sensing devices, among many others. As those skilled in the art will readily appreciate, device layer 108 will typically be a conglomeration of various layers of conductive, semiconductive (doped as needed), transparent, opaque, reflective, refractive, filtering, energy sensitive and/or insulative, etc., barrier layers confronting surface 116 and formed monolithically with donee layer 104. Indeed, in the contexts of electronic and optoelectronic applications, device layer 108 may include one or more device sub-layers (not shown) that each contains functional electrical, optical and/or optoelectronic devices 120 and one or more wiring sub-layers (not shown) that each contains wiring for connecting the electrical devices with one another and/or with other devices outside of device structure 100. In addition, skilled artisans will recognize after reading this entire disclosure that device layer 108 may include the silicon on insulator (SOI) and semiconductor material on insulator (SMOI) layers discussed below in connection with FIG. 12A through FIG. 16D. Consequently, those skilled in the art will readily understand that device structure 100 may be used in the manufacture of any of a huge variety of devices, including displays, microprocessors, lighting fixtures and energy sensors, among many others. The Background section above and the '240 application lists many more, but certainly not all, of the uses for device structure 100.

Handle 112 acts as a backing substrate or platform in liberating the monolithic donee layer 104/device layer 108 from the donor by cleaving. Handle 112 may be made of, or otherwise include, any of a wide variety of materials compatible with device structure 100. For example, handle 112 may be made of an organic polymer, inorganic polymer, an organometallic polymer, a hybrid organic/inorganic polymer, a silicate, a metal, a paper, a glass and/or a fabric, among others. Handle 112, can be either relatively rigid or flexible. If handle 112 is flexible, it may be used in a roll-to-roll process as described in detail below. The '240 application lists a number of the many materials that may be used for/in handle 112. Depending on the circumstances, handle 112 may serve the function of a decoupling layer, albeit there are no surface defects (in the typical sense of deposited films) to be decoupled.

Figure 2A:
FIGS. 2A-D are diagrammatic cross-sectional views illustrating various steps of a method of the present invention that may be utilized to make the device structure of FIG. 1.

FIGS. 2A-D and 3 illustrate and describe a method 300 of the present disclosure that may be used to make device structure 100 of FIG. 1. (To facilitate reading this disclosure in conjunction with the figures, reference numerals begin with the figure number of the figure containing the element referenced. The exception is that like elements from FIG. 1 are repeated in FIGS. 2A-D with the same numerals.) Method 300 may begin at step 305 with providing an appropriate crystalline donor 200 as shown in FIG. 2A. Again, crystalline donor 200 may be virtually any crystalline mass that may be cleaved to provide at least one donee layer, such as donee layer 104 (see also FIG. 1). In order to provide donor 200 at step 305, it will generally be necessary to have ascertained the strength of the cleavage plane(s) that will be utilized in liberating the donee layer(s), e.g., donee layer 104, and have planned the steps that will be used to cleave the donee layer(s) from the donor (see below).

Figure 2B:
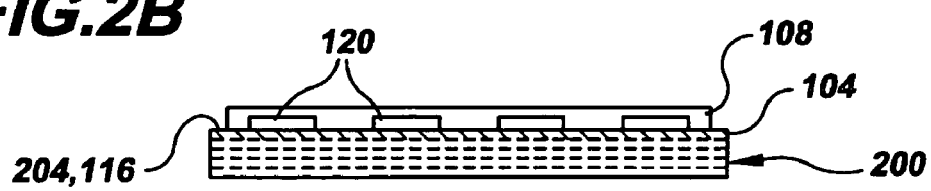

At step 310 and as seen in FIG. 2B, device layer 108 is fabricated so as to confront the free surface 204 of donor 200, which is also surface 116 of donee layer 104, and so as to be monolithic with the donee layer. As those skilled in the art will manifestly understand, in reality step 310 will comprise a number of sub-steps that may include any one or more of film/layer forming (growing, depositing, coating, etc.), doping, oxidizing, removal (etching, ablating, etc.) steps performed in the necessary sequence(s) to creating functioning device(s) 120. Those skilled in the art will readily understand that the processes and means utilized in step 310 are so varied that it is impractical to describe this step in further detail. That said, these processes and means are so ubiquitous in the art that further detail is unnecessary.

Figure 2C:
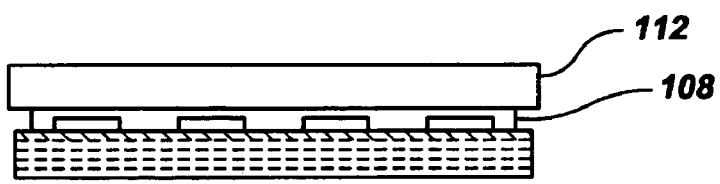
Figure 2D:
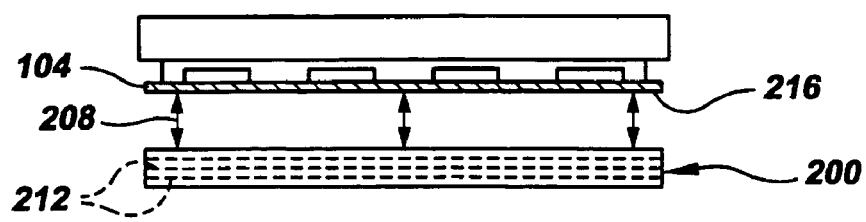

After device layer 108 has been fabricated at step 310, including any barrier, planarizing and/or other layers (not shown) that may be desired to facilitate the attachment of handle 112 to the device layer and/or for some other reason, at step 315 the handle may now be attached to the device layer as shown in FIG. 2C. There are many ways to attach handle 112 to device layer 108. These include chemical bonding using an epoxy, an adhesive, room-temperature vulcanization, a silicone, urethane, etc. These chemicals may be cured/activated using plasma, light (including UV and IR), heat, pressure, an anaerobic environment, etc. Bonding may also be initiated by surface treatments using, e.g., chemicals, activated plasma treatments, vacuum processes, etc. Attaching processes may also include other bonding techniques, such as microwave, anodic, fusion, adhesive, eutectic, resist, solder, thermocompression and/or low temperature glass, etc. Those skilled in the art will readily appreciate that these lists are illustrative and not limiting.

After handle 112 has been suitably secured to device layer 108, at step 320 crystalline donee layer 104 may be liberated from donor 200 (as illustrated by arrows 208) using any cleaving process and means appropriate for the crystalline material of the donor. Cleaving is the process of separating a material along a natural crystal plane of the material, such as any one of cleavage planes 212 of donor 200. Separation along a natural plane creates the cleanest surface possible due to the regularity of the material's atomic structure. Cleaved surfaces are essentially perfectly smooth due to their atomic-level smoothness. In this connection, it is noted that if desired, donee layer 104 may act as a planarizing layer, i.e., a layer having a low surface roughness. The '240 application described a number of cleaving methods and means that may be used to liberate donee layer 104 from donor at step 320. Even these are not exhaustive, but merely illustrative.

Following cleaving, device structure 100 may be further processed or used in creating an end-product using methods and means well known in the art. Further processing may include, among other things: fabricating a second device layer (not shown) on the just-cleaved surface 216 of donee layer 104; forming one or more barrier layers (not shown) on the just-cleaved surface; or removing the donee layer and performing further processing/fabrication on the side of device layer 108 opposite handle 112. Those skilled in the art will readily appreciate the variety of further processing electronic structure may be subject to. After all processing has been completed, device structure 100 may be separated, e.g., diced, from other device structures (not shown) that may have been made in parallel on the same donee layer 104 and packaged or otherwise used in creating an end-product. The types of post-processing of device structure 100 are many, and each is well within the ordinary skill in the relevant art.

It is noted that some crystalline masses used for donor 200 may require each cleavage plane 212 to be weakened prior to cleaving. In order to weaken each cleavage plane 212, donor 200 may be subjected to stress, strain, shear, tension, and other forms of mechanical, chemical, electrical, radiation treatments during or prior to initiating the cleave to help facilitate/expedite the cleaving action. This treatment may be flood, time-varying, spatially varying, or continuous, and may be done at once, multiple times or in stages essentially anytime from the selection of donor 200 to the cleaving step 320 to suit the treatment. The '240 application describes and illustrates some of these treatments in more detail.

FIG. 4A illustrates an alternative device structure 400 made in accordance with the present disclosure. Whereas device structure 100 of FIG. 1 had device layer 108 formed prior to cleaving donee layer 104 from donor, generally the first steps in creating device structure 400 of FIG. 4A are the attaching of handle 404 to donee layer 408 of a crystalline donor 412 (FIG. 4B) and the liberating of the donee layer (and handle) from the crystalline donor (FIG. 4C) so as to create a crystalline surface 416 suitable for fabricating a device layer 420 thereon (FIG. 4A). Donor 412, handle 404 and device layer 420 may be the same as the respective donor 200, handle 112 and device layer 108 described above in connection with FIGS. 1-3. In addition, the processes and means used for creating device 400, e.g., cleavage plane weakening treatments, processes and means for attaching handle 404 to donee layer 408, processes and means for liberating the donee layer from donor 412 and processes and means for fabricating device layer 420, may be the same as those processes and means described above in connection with FIGS. 1-3. Again, the processes and method specifically described above and in the '240 application incorporated herein by reference are illustrative and not limiting.

Figure 5:
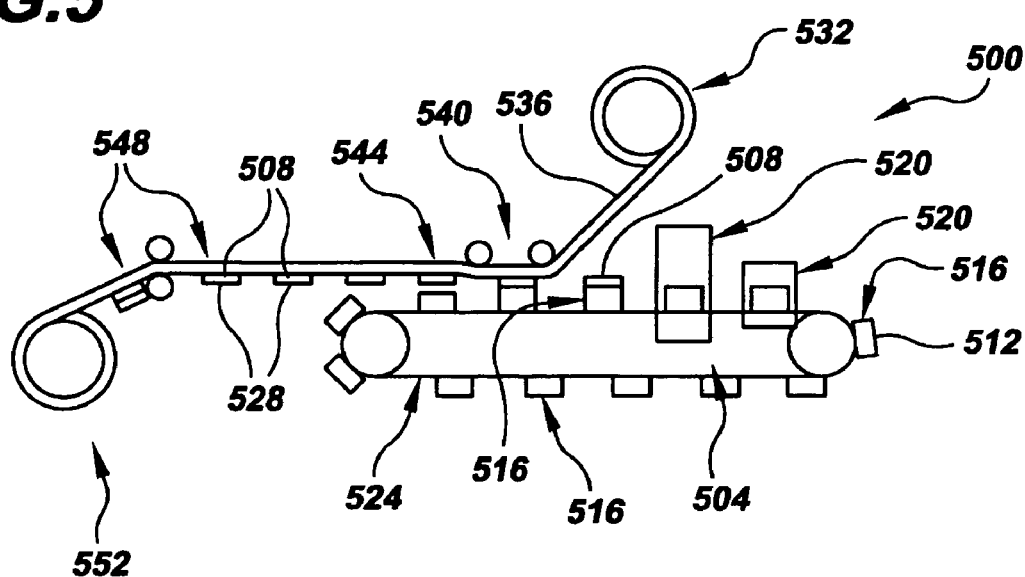
FIG. 5 is a high-level schematic diagram illustrating a roll-to-roll processing system that may be used to make the device structure of FIG. 1.

Referring now to FIG. 5, this figure illustrates a roll-to-roll (R2R) system 500 that may be used to fabricate device structure 100 of FIGS. 1-3 in which device layer 108 is formed prior to attaching handle 112 and cleaving donee layer 104 from donor. R2R system 500 may include a device-layer fabricator 504 operatively configured for fabricating a device layer 508 on the free surface 512 of each crystalline donor 516. Again, each device layer 508 may be device layer 108 of FIGS. 1-3. Consequently, device-layer fabricator 504 may include any one or more processing stations 520, e.g., deposition/growth chambers, etching chambers, ablation chambers, coating chambers, chemical-mechanical polishers, etc., necessary to fabricate each device layer 508. Although each crystalline donor 516 may be the same as donor 200 of FIGS. 2A-D and FIG. 3 and, thus, may be virtually any crystalline material, in the present example each donor is a mass of lamelliform sheets of the fluorine mica, fluorophlogopite ($KMg_3(AlSi_3O_{10})F_2$). Fluorophlogopite has relatively very weak cleavage planes between the lamelliform sheets and, thus, does not require any significant treatment to weaken the cleavage planes. However, if one or more cleavage plane weakening treatments were required, the corresponding treatment station(s) could be provided upstream of, downstream of and/or among processing stations 520.

Since in this example each donor 516 is a fluorophlogopite mass containing tens, hundreds or thousands of lamelliform sheets, device-layer fabricator 504 may include a conveyor, here a belt-type conveyor 524, for moving donor 516 between (or among) processing stations 520. Of course, alternatives to belt-type conveyor 524 and straight-line arrangement of processing stations 520 may be used. For example, this setup may be replaced by one or more flexible manufacturing stations and corresponding robotic arm(s) or other conveying means. The set-up shown is presented for convenience of illustrating the recycleability of donors 516 due to their multi-lamelliform composition that allows a single donor to be cleaved multiple times to provide a corresponding plurality of donee layers 528.

R2R system 500 may also include a pay-out reel 532 that pays out a flexible handle 536 that may be made of any suitable flexible material, which includes a series of relatively rigid segments (not shown) linked together to form a flexible chain. R2R system 500 also includes a donee-layer affixer 540 and a donee-layer cleaver 544 for, respectively, affixing each donee layer 528 (and corresponding device layer 508) to flexible handle 536 and cleaving that donee layer from the corresponding donor 516. As those skilled in the art will readily appreciate, affixer 540 may utilize any of the processes discussed above relative to FIGS. 1-3 in connection with attaching handle 112 to device layer 108. Likewise, those skilled in the art will also readily appreciate that cleaver 544 may utilize any of the cleaving processes also discussed above in connection with FIGS. 1-3 and described in more detail in the '240 application. It is noted that affixer 540 and cleaver 544 may work in close conjunction with one another. For example, it is conceivable that a process could be implemented in which each donee layer 528 is cleaved and the corresponding device layer 508 forced into attaching contact with handle 536 by the cleaving process. An example of this is wherein each device layer 508 and/or handle 536 are provided with a tacky layer prior to cleaving and each donee layer 528 is cleaved by a razor blade that forces the device layer upward (in FIG. 5) so that the tackiness causes the monolithic device layer/donee layer structure to adhere to the handle.

After device layer 508 and donee layer 528 have been attached to flexible handle 536 and liberated from the corresponding respective donor 516, the flexible handle and device and donee layer (i.e., "completed" device structures 548) may be taken up by a take-up reel 552. Once take-up reel 552 is full, it may be transported to another work area for further processing or handling. Alternatively, electronic structures may be fed directly to one or more additional processing and/or handling stations. As those skilled in the art will readily appreciate, R2R system 500 is presented for illustrating some of the broad concepts involved in the process of creating device structures 100, 548 of the present disclosure. Of course, there are many variations possible.

In addition, those skilled in the art will readily appreciate the modifications of R2R system 500 needed to adapt the system for creating electronic structures similar to device structure 400 of FIGS. 4A-D, i.e., an electronic structure having a donee layer (408) cleaved from a crystalline donor (412) prior to fabricating the device layer (420). In this case, affixer 540 and cleaver 544 could be moved upstream of device-layer fabricator 504 so that the donee layers (528) could be liberated prior to fabrication of the corresponding respective device layer (508). Then, device-layer fabricator 504 could be modified to fabricate each device layer (508) to be monolithic with the corresponding respective donee layer (528) and portion of flexible handle 536. Depending upon the type(s) of processing stations 520, it may also be desirable to re-orient the donee layers (528) prior to fabricating the device layers (508) so that their free surfaces (512) are in a different orientation, e.g., facing upward relative to FIG. 5 rather than downward.

Those skilled in the art will readily appreciate that, regardless of whether a device structure of the present disclosure is made using an R2R or other process, such as a batch process, there are an infinite number of geometrical shapes that the donor, transferred crystalline film and "completed" electronic structure may take. For example, each of these items may be square, rectangle, triangle, hexagon or virtually any other geometrical shape, some of which may be directly related to the natural shape of the underlying crystal used as the donor and some of which may not. In the later case, the shape may result from cutting or otherwise shaping the structure along a path that strays at least some from a natural cleavage plane.

Figure 6:
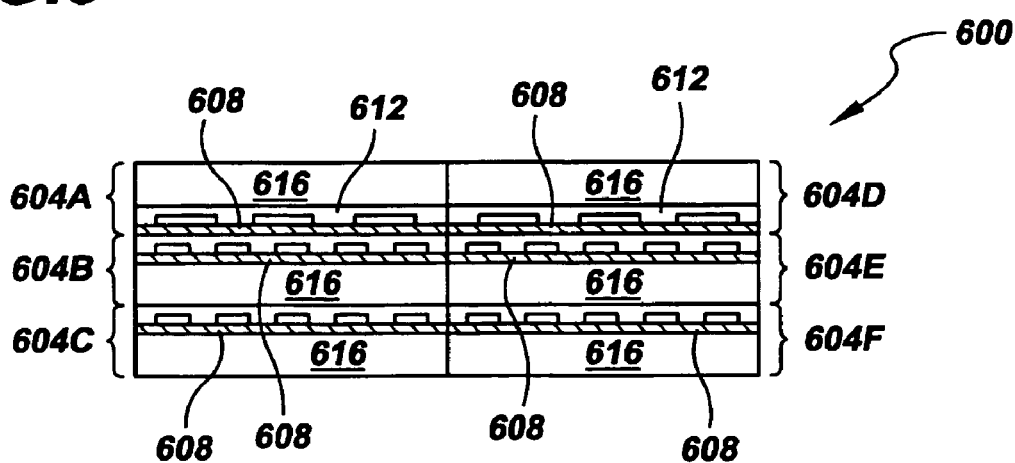
FIG. 6 is a cross-sectional view of a stack of multiple device structures made in accordance with techniques of the present disclosure.

Depending on the shape and functionality of a given electronic structure made in accordance with the present disclosure, e.g., either of device structures 100, 400 of FIGS. 1 and 4A, respectively, multiple such structures may be arranged and functionally, e.g., electrically and/or optically, interconnected into a conglomerate structure so as to interact and/or act in parallel with one another. FIG. 6 illustrates such a conglomerate structure 600. FIG. 6 shows six device structures 604A-F of conglomerate structure 600, which may have more conglomerate structures than shown. Each device structure 604A-F may be of either the "cleave-after-device-layer" type (100) of FIG. 1 or the "cleave-before-device-layer" type (400) of FIG. 4A. In conglomerate structure 600, device structures 604A-F are both stacked three deep and placed side-by-side. Each device structure 604A-F may include a donee layer 608, a device layer 612 and a handle 616 stacked in various orders according to the way it was fabricated.

Stacking may be used, e.g., to create multiple layers of like device structures, e.g., layers of different color pixel arrays, to create multiple layers of differing, but cooperative device structures, e.g., an electroluminescent layer and an active backplane or to create multiple layers containing both like and cooperative electronic structures, e.g., layers of different color pixels in conjunction with an electroluminescent device layer and an active backplane. It is noted that the side-by-side arrangement is typically referred to as "tiled" when the side-by-side device structures are functionally alike and "attached" when the side-by-side device structures are functionally different. Those skilled in the art will readily recognize situations in which stacking, tiling and/or attaching can be used. In this connection, the designer of a stacked conglomerate structure, e.g., structure 600, will need to select materials for each handle 616, device layer 612 and donee layer 608 with consideration as to whether such layers need to be transparent or can be opaque.

B. Example Device Structures

B.1. Flexible TFT Structure for an Active Matrix Backplane

Active matrix display driving schemes typically require a diode/thin film transistor (TFT) or a conventional thick film (substrate, CMOS) transistor. These can be further subdivided into: 1) a two-terminal thin film diode (such as the metal-insulator-metal diode, ring diode, back-to-back diode, etc.) or 2) a three terminal TFT made of, e.g., CdSe, amorphous silicon, high temperature poly silicon (HTPS), low temperature poly silicon, ultra-low temperature poly silicon, single crystal silicon, polymers, etc. The TFTs may be of the PMOS or NMOS flavor. They may have planar structures, or staggered structures. They may be bottom gate/top gate, etc. As is obvious from above, there are virtually infinite types of device architectures in current use, each tailored for optimum devices performance.

Figure 7A:
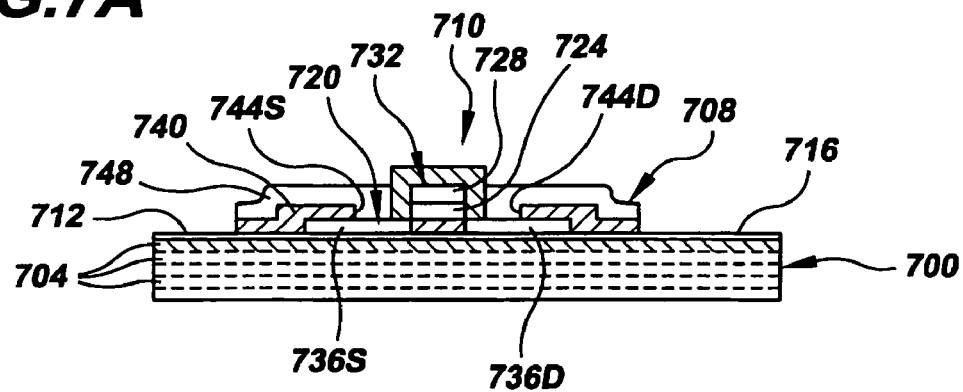
FIGS. 7A-C are cross-sectional views illustrating various stages of the creation of a device structure, made in accordance with the present disclosure, that includes a thin-film transistor layer on a flexible substrate.
Figure 7B:
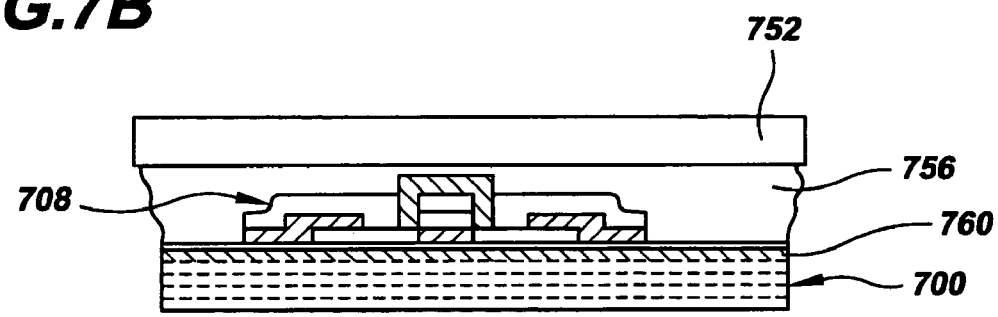
Figure 7C:
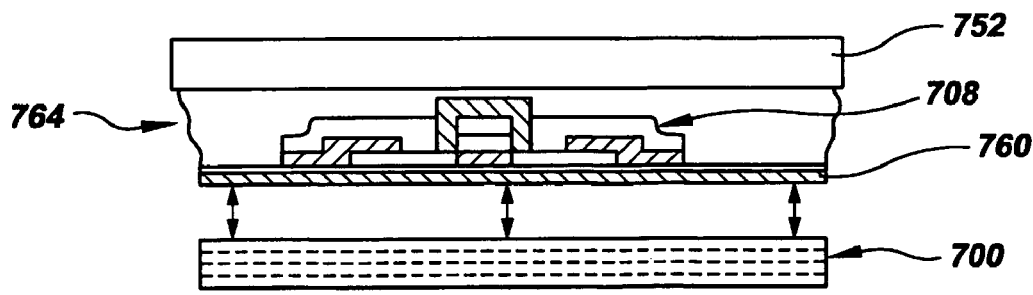

With TFTs (and thin-film diodes) being so prevalent in the display industry, and with flexible displays being a goal of future generation display technology, it is appropriate to provide an example of creating a TFT device layer on a flexible substrate. Referring to FIGS. 7A-C, FIG. 7A illustrates a micaceous/lamellar donor 700, e.g., a fluorophlogopite mass, comprising many lamelliform sheets 704, each of which may be used as the flexible substrate of a completed electronic TFT device structure. A TFT device layer 708 containing a TFT 710 is formed on the free surface 712 of donor 700. It is noted that micaceous/lamellar donor 700 is made of a crystalline material that is essentially immune to damage during the fabrication of TFT device layer 708. It is also noted that prior to cleaving (see below) donor 700 provides a relatively rigid substrate for fabricating TFT device layer 708. TFT 710 is a typical self-aligned top gate TFT that may be fabricated as follows.

First, a barrier oxide layer 716 is deposited on free surface 712 of donor 700. Amorphous silicon is then deposited onto barrier oxide layer 716 and crystallized into a polysilicon layer 720 using conventional processing. Then, a gate oxide layer 724 is deposited on polysilicon layer 720 and a gate electrode layer 728 is deposited onto the gate oxide layer. A gate structure 732 is patterned per the desired feature size and design rules, exposing source and drain regions 736S, 736D. After they are exposed, source and drain regions 736S, 736D are suitably doped and are patterned per the feature size and design rules as desired. A contact isolation oxide 740 is deposited and contact holes 744S, 744D are patterned and etched. A patterned metal layer 748 is then deposited. An indium tin oxide (ITO) or other transparent electrode (not shown) for establishing contact with a pixel can be deposited as desired. Following the fabrication of TFT device layer 708, a relatively flexible handle 752 is attached to the TFT device layer as shown in FIG. 7B, e.g., using an epoxy adhesive 756. After handle 752 has been attached and adhesive 756 suitably cured, the donee layer 760 may be liberated from donor 700 by cleaving as shown in FIG. 7C. The result is a flexible TFT structure 764 in which TFT device layer 708 is formed on a flexible substrate, i.e., flexible handle 752. If desired or necessary, donee layer 760 may be removed. Those skilled in the art will readily understand that this example is merely illustrative and by no means limiting.

B.2 Flexible Electroluminescent Structure

There are many types of high-field, impact-excitation based electroluminescent (EL) devices, such as thin film EL (TFEL), thick film EL, thick dielectric film EL (TDFEL), inverted TFEL (ITFEL) and upright structure, among others. These devices are available in each of monochrome and color, and they are either driven using a passive matrix (PM) or an active matrix (AM) scheme. EL devices and displays are solid state devices that have numerous advantages over competing display technologies like LCD, OLED, etc. They are robust and highly insensitive to their operating environment and have long device lifetimes, can operate over wider temperature ranges, are shock resistant and are generally impervious to normal wear and tear.

To realize consistently optimum quality in the dielectric properties of the insulator layer and high efficiency phosphor emissions, the insulator and phosphor layers should be deposited at high temperatures. Processes like atomic layer deposition and atomic layer epitaxy are commonly used. It is also not uncommon to deposit/lay/sol-gel a planarizing layer on top of the insulator layer prior to phosphor deposition for more consistent and uniform EL emission. Furthermore, sintering and/or annealing of the phosphor layer is conducted to activate its optimum emission characteristics. All these high temperature processes dictate the use of high strain point substrates, and, therefore, all devices thus far have been on rigid platforms.

These processing requirements, which are largely incompatible with conventional techniques for creating flexible devices, serve to highlight some of the benefits of the techniques of the present disclosure. Indeed, the techniques of this disclosure may be used to create flexible EL structures using many of the conventional techniques presently used for creating rigid EL structures. The techniques of the present disclosure readily adapt to established manufacturing processes for monochrome or color devices and passive or active matrix driving schemes, thereby allowing the creation of new market entrants into the field of flexible displays.

Figure 8A:
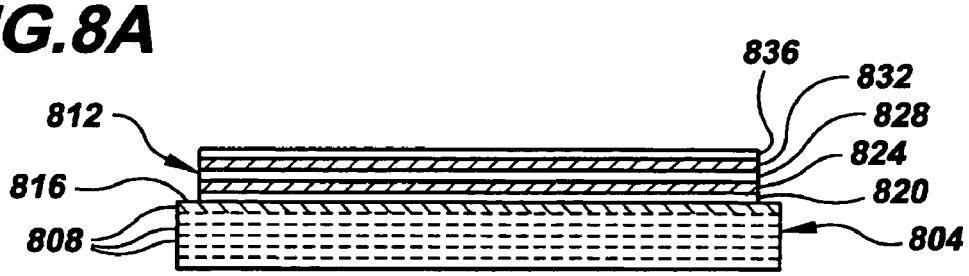
FIGS. 8A-C are cross-sectional views illustrating various stages of the creation of a device structure, made in accordance with the present disclosure, that includes an electroluminescent device layer on a flexible substrate.
Figure 8B:
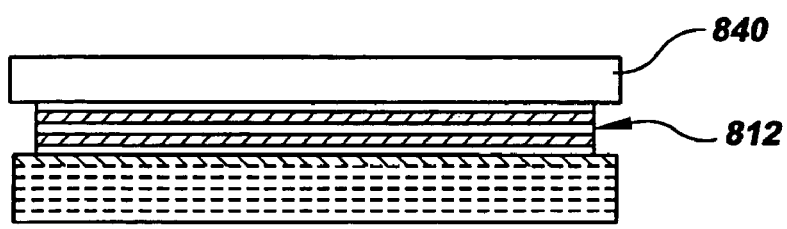
Figure 8C:
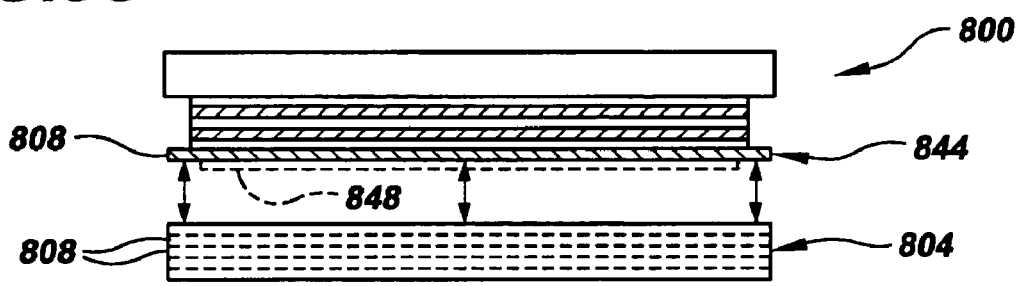

Referring now to FIGS. 8A-C, these figures illustrate various stages during the creation of a flexible EL structure 800 (FIG. 8C) using techniques of the present disclosure. As shown in FIG. 8A the creation of flexible EL structure 800 of this example begins with a micaceous-lamellar donor 804, in this case a fluorophlogopite mass having a plurality of lamelliform sheets 808 initially secured to one another along relatively very weak cleavage planes. Once donor 804 has been provided, EL device layer 812 may be fabricated on a free surface 816 of the donor. In this example, EL device layer 812 includes a "bottom" electrode layer 820, a first dielectric layer 824, a phosphor layer 828, a second dielectric layer 832 and a "top" electrode 836. Since fluorophlogopite donor 804 can withstand relatively high temperatures, conventional EL device forming techniques can be used to fabricate EL device layer 812. As illustrated in FIG. 8B, after EL device layer 812 has been formed at relatively high temperatures, a flexible handle 840 is secured to the EL device layer using any suitable attaching technique. It is noted that flexible handle 840 will typically be made of a material that could not withstand the temperatures that were just used to fabricate EL device layer 812.

After flexible handle 840 has been securely attached to EL device layer 812, as seen in FIG. 8C donee layer 844, i.e., one (or several, if desired) of lamelliform sheets 808 of micaceous/lamellar donor 804, is cleaved from the donor so as to liberate EL structure 800 from the donor. After EL structure 800 has been liberated from donor 804, if desired a black matrix 848 may be formed on the side of donee layer 844 opposite EL device layer 812. EL structure 800 may now be used as desired.

Figure 9:
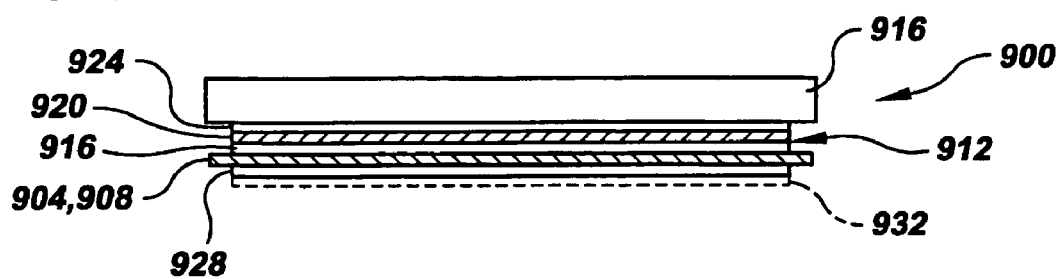
FIG. 9 is a cross-sectional view of an alternative device structure, made in accordance with the present disclosure, that includes an electroluminescent device layer on a flexible substrate.

FIG. 9 illustrates one variation of EL device 800 of FIGS. 8A-C. In the EL structure 900 of FIG. 9, donee layer 904, which has been cleaved from a donor (not shown) in essentially the same manner as donee layer 844 of FIG. 8C, serves as a dielectric layer 908 of the EL structure. Comparing EL structure 900 of FIG. 9 to EL structure 800 of FIG. 8C, dielectric layer 908 is equivalent to first dielectric layer 824. EL structure 900 of FIG. 9 may be made by first fabricating a partial EL device layer 912 on the donor, securing a flexible handle 916 to the partial EL device layer and cleaving donee layer 904 from the donor. In this example, partial EL device layer 912 includes a phosphor layer 916, a second dielectric layer 920 (donee layer 904 being the first) and a "top" electrode layer 924. After donee layer 904 has been cleaved, a "bottom" electrode 928 may be formed on the donee layer and a black matrix layer 932 added, if desired.

Since the revealed layer transfer technology includes cleaving of crystalline planes, the donee layer, e.g., donee layer 844, 904, serves multiple functions. Not only does it form the flexible platform on which the EL device layer is fabricated, it can also act as an intrinsic planarizing layer and may also function as the dielectric layer, e.g., as in EL structure 900. The crystalline nature of this dielectric layer gives it better and more consistent properties than deposited dielectrics.

Those skilled in the art will manifestly understand that the preceding TFT and EL examples are just a few of the many display structures that may be made using techniques disclosed in the present application. As discussed above and in the '240 application incorporated herein by reference in its entirety, the display structures that may be made using the disclosed techniques are immensely diverse and range across many segments of the electronics industry.

B.3 Electronics Devices

The cleaving/layer transfer techniques described above are also applicable to the electronics industry. Similar to the fabrication of TFTs and EL devices just described, most electrical circuit components, e.g., resistors, capacitors, inductors, bus lines, electrodes, etc. can be miniaturized and realized using CMOS, MOS, FET, MOSFET, BJT, JFET and other semiconductor technologies. Consequently, virtually any type of electronic devices may be made in part using the techniques disclosed in the present application. Electronic devices made using these techniques allow these devices and/or components thereof to be flexible, less power-consuming and more portable/mobile. Examples of such electronics devices include, but are not limited to, mobile telephones, mobile video cameras, personal computers, head-mounted displays, rear- and front-type image projectors, digital signal processing apparatus, personal digital assistants, electronic organizers and electronic signboards, among many others. The '240 application lists, non-exhaustively, a variety of components of these and other electronic devices that may be made using techniques disclosed herein. These components may take the form of device structure 100 of FIG. 1, device structure 400 of FIG. 5 or stacked and/or tiled conglomeration of such structures with like structures and/or conventionally fabricated structures. The applicability of the disclosed techniques to the electronics industry are essentially as broad as the electronics industry itself.

B.4 Flexible Radiation Detector

Figure 10:
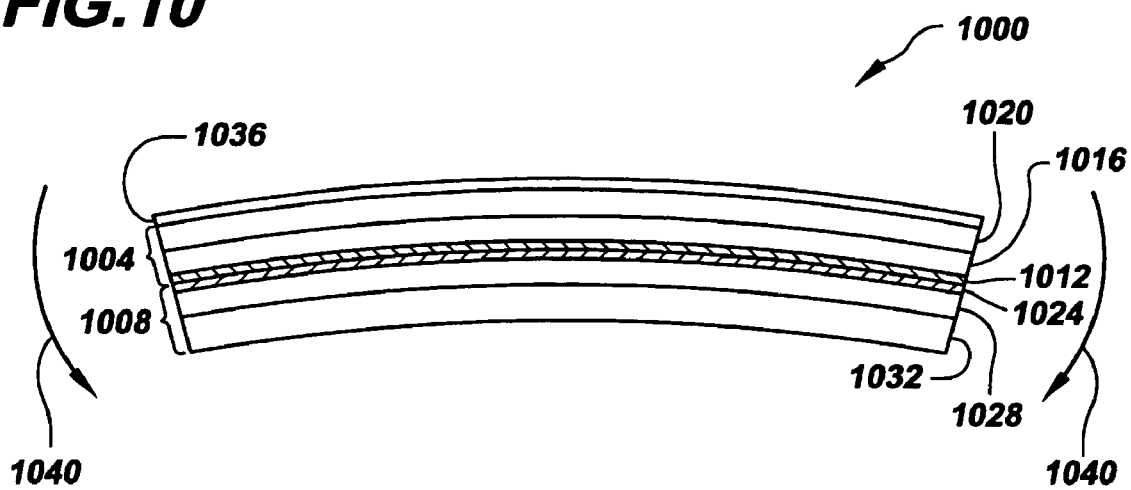
FIG. 10 is a cross-sectional view of a flexible x-ray detector structure made in accordance with the present disclosure.

Techniques of the present disclosure may also be used in the sensor/detector industry to create flexible and conformal sensors/detectors, such as electromagnetic energy detectors, e.g., visible light, infrared, ultraviolet, x-ray, etc. and pressure sensors, among many others. The '240 application contains a representative list of detector/sensor types and configurations that may be made using techniques of the present disclosure. To illustrate one example, FIG. 10 shows a flexible, conformal x-ray detector 1000 that includes a pixel structure 1004 and an amplifier structure 1008 that are each made in manners similar to, respectively, device structure 100 of FIG. 1 and device structure 400 of FIG. 4. In the example shown, pixel structure 1004 includes a donee layer 1012, pixel device layer 1016 and translucent handle 1020, and amplifier structure 1008 includes a donee layer 1024, an amplifier device layer 1028 and a handle 1032. Each of pixel device layer 1016 and amplifier device layer 1028 may be made using conventional techniques for fabricating such layers.

After pixel structure 1004 and amplifier structure 1008 have been made, they are stacked with one another generally in the manner of conglomerate structure 600 of FIG. 6 and functionally interconnected with one another by adopting well-know techniques to this laminated structure. If pixel structure 1004 is responsive to visible light, e.g., as in a charge-couple device or CMOS detector, a scintillation layer 1036 may be provided to create visible light photons for the visible light detector upon impact of the x-rays. Scintillation layer 1036 may be provided either prior to or after stacking pixel structure 1004 and amplifier structure 1008. A useful feature of x-ray detector 1000 made using techniques of the present disclosure in connection with flexible donee layers 1012, 1024 and handles 1020, 1032 is that the detector itself is flexible, allowing it to be bowed or otherwise flexed into a desired curved shape, as indicted by arrows 1040. Such a curved x-ray detector may be used, e.g., for a human x-ray device in which x-ray detector 1000 more closely conforms to the shape of the human body or body part under investigation than conventional flat x-ray detectors.

As those skilled in the art will readily appreciate, x-ray detector 1000 is merely illustrative of the many types of sensor/detector devices that may be created using techniques of the present disclosure. Other examples are provided in the '240 application, which has been incorporated herein by reference above. It will also be appreciated that these examples are by no means exhaustive.

B.5 Flexible Laser Diodes

In addition to the many applications of the presently disclosed techniques to the display, electronics and sensor/detector industries as exemplified above, these techniques may also be used for a wide variety of applications in the optics and optoelectronics industries. For example, it is often desirable to have high-quality optical thin films on flexible substrates. However, high substrate/growth chamber temperatures are typically required for realizing high-quality, high-performance films. In addition, mesa structures such as photonic crystals use chemical and plasma etchants that prohibit use of conventional flexible substrate. Using techniques of the present disclosure in connection with high-temperature-resistant, etch-resistant donors, which provide high-temperature-resistant, etch-resistant donee layers, overcome these shortcomings of conventional techniques.

Consequently, techniques of the present disclosure can be used to create, among other things, flexible, conformal, single and multi-layer optical thin films, such as filters, reflection films, dichroic mirrors, polarizers, gratings, 2D-3D mesa structures (photonic crystals), telecom circuits, etc. Use of these techniques also provides the basis for directly realizing flexible/conformal optoelectronic devices, such as radiation sources and detectors.

Figure 11:
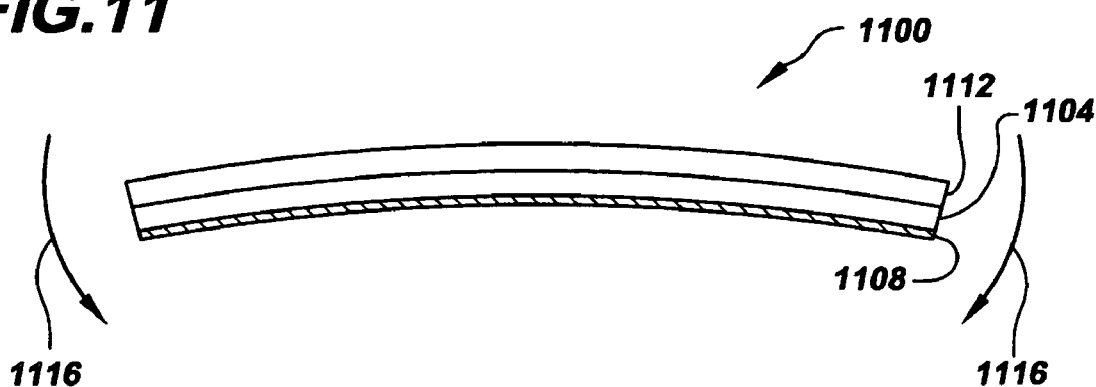
FIG. 11 is a cross-sectional view of a flexible laser diode structure made in accordance with the present disclosure.

In this connection, FIG. 11 illustrates a flexible laser diode structure 1100 that may be made in accordance with device structure 100 of FIG. 1. That is, laser diode structure 1100 may be made by fabricating a laser diode layer 1104 on a donee layer 1108 made of a material resistant to the relatively high temperatures required to fabricate the laser diode layer. One example of such a material is the fluorophlogopite crystal material mentioned above. Donee layer 1108 of fluorophlogopite crystal may be obtained by cleaving one (or more) of the lamelliform sheets from a multilayer mass of such sheets, i.e., a fluorophlogopite donor (not shown, but similar to donor 200 of FIGS. 2A-D).

Laser diode layer 1104 may be formed on donee layer 1108 in a conventional manner and may contain any of a number of laser diode types, such as double heterostructure, quantum well, separate confinement double heterostructure, distributed feedback, vertical cavity surface emitting, vertical external cavity surface emitting, etc. After laser diode layer 1104 of the desired type has been formed, a handle 1112 may be secured to the laser diode layer to assist in cleaving donee layer 1108 from the donor. It is noted that either of handle 1112 and donee layer 1108 may be selected to be transparent to some or all of the wavelengths emitted from laser diode layer 1104. After laser diode structure 1100 has been fabricated, it may be flexed into a desired curved shape (as depicted by arrows 1116) and mounted to a supporting structure (not shown) that maintains the desired curvature. Such curvature may be useful, e.g., for dispersing the emissions from laser diode layer 1104 instead of using lens structures. Of course, one or more lens layers (not shown) could be added to laser diode structure 1100, e.g., before or after the attachment of handle 1112. Of course, curvature may be desired for other reasons. In addition, those skilled in the art will manifestly understand that the foregoing laser diode example has been presented to illustrate basic principles of the present disclosure that may be exploited in the optics and optoelectronics industries. There are many other applications of these basic principles that are well within the knowledge of skilled artisans.

In view of the foregoing, those skilled in the are will appreciate the following and other benefits of using presently disclosed techniques in manufacturing electronic, optoelectronic and optic device structure. For example, the techniques of the present disclosure allow for 'best-of-breed" solutions for specific needs. Since these techniques allow device performance to be decoupled from the choice of substrate, the processes utilized to fabricate devices can be tailored and optimized for specific applications and devices without undue concern for the effect of these processes on the substrate. Depending upon the choice of the donor material, techniques revealed herein are compatible with virtually all conventional process chemistries and temperature ranges. For example, these techniques are compatible with both low- and high-temperature single-crystal-growth processes such as liquid, vapor and solid phase epitaxy, performed at temperatures ranging, e.g., from 0° C. to 1200° C. In addition, these techniques are compatible with presently emerging technologies, such as excimer laser annealing, etc., and will likely be compatible with many future technologies, as well.

In the context of TFTs used in, among other things, display and integrated circuit technologies, the revealed techniques allow, e.g., for:
 high carrier mobility;
 consistency and repeatability in carrier mobility and grain size;
 high-quality/best-quality gate oxide; and
 high-quality transparent and opaque electrodes.

In addition, the donee layer can function as a natural planarizing layer for the fabrication thereon of high-quality films and devices due to the low atomic level surface roughness resulting from atomic-level cleaving. Donors may be reused many times over, each time providing a donee layer that does not require polishing prior to subsequent processing. Devices made using the presently disclosed techniques can have high reliability due to the ability to use well-know and well-categorized device layer fabrication processes and tools. The revealed techniques utilize low temperature/room temperature processes. Therefore, there is little or no thermal stress induced into the device structures. Consequently, the techniques herein disclosed allow for realizing flexible and conformal devices without the manufacturing issues associated with registration accuracy during lithography, dimensional stability of substrates, patterns, handling of thin substrates, etc.

Furthermore, the presently revealed processes allow for the fabrication of devices on flexible substrates, such as metal foils, polymers and plastics. These processes are based on the cleaving of crystalline donors along crystal planes and is, therefore, highly predictable and repeatable and can be easy. The novel techniques involve relatively few processing steps and allow for direct transfer of built devices. There is little to no substrate preparation involved with fabricating device layers on the donee layers. These techniques also allow for the practical realization of devices that are currently not possible or are prohibitively expensive.

The techniques revealed herein utilize and leverage all existing technological and capital platforms, from manufacturing and production to inspection and analysis and, as such, is easily integratable and thereby low in cost. No multi-billion-dollar re-investments and/or significant technological hurdles need to be crossed, thereby affording significant cost savings and reduction in time to market. The donee layer onto which a device layer is fabricated may be chosen or designed to be used for multiple purposes. For example, it may: work as a substrate; be doped to operate as conductive cathodes; work as a dielectric layer; work as a planarizing layer; work as a barrier protection layer from humidity and moisture; be color-doped to work as a black matrix to increase display contrast; be transparent for direct viewing applications and head-mounted displays; absorb UV radiation and thus provide UV protection; etc.

The presently disclosed techniques lend themselves to creating unique devices by attaching various functions together, or by tiling devices to build a very large device or by building devices one on top of another and creating 3devices by 3D integration. Furthermore, because the presently revealed techniques are based on existing technology, multi-source agreements between vendors and suppliers can easily be formulated to further reduce cost and increase availability.

C. Semiconductors On Insulators

In addition to creating various electronic structures as discussed above, techniques of the present disclosure may be used to make a wide variety of semiconductor material on insulator (SMOI) substrates that may be used in substantially the same way as conventional silicon on insulator (SOI) substrates. Indeed, techniques of the present disclosure may be used to make "semiconductor material on anything" (SMOA) substrates, e.g., crystalline silicon on glass, crystalline silicon on plastic and crystalline silicon on metal, among many others. The '240 application incorporated herein by reference above describes some of the many varieties and uses of SMOI and SMOA substrates made in accordance with the present disclosure.

Some advantages of using techniques of the present disclosure to create SMOI and SMOA substrates include, among others, creating such substrates having: low dislocation density; low stress due to the compliant nature of the donee layer; ultra-flat and ultra-low RMS surface roughness due to the atomic level flatness of the underlying starting donor substrate; ultra-thin layers of elemental or compound semiconductor material; flexibility/conformability and a shatter proof nature. Techniques of the present disclosure also allow for realizing SMOI and SMOA substrates inexpensively, thereby opening up market applications heretofore not accessible due to the manufacturing cost and limitations of conventional SOI techniques. In addition, presently revealed techniques allow for forming heteroepitaxial semiconductor layers of virtually any thickness, e.g., from less than 1 nm to greater than several hundred microns. On the lower end of this broad range, techniques of the present disclosure readily allow SMOI semiconductor layers to be 30 nm and less, which is smaller than present silicon layer transfer processes can typically achieve.

Figure 12A:
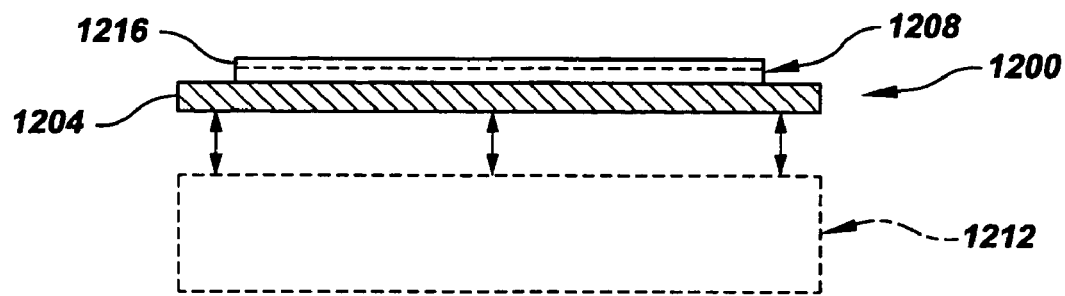
FIGS. 12A-C are cross-sectional views showing several semiconductor material on insulator (SMOI) substrates made using techniques of the present disclosure.

FIGS. 12A-C, 13A-C, 14A-C, 15A-C and 16A-D illustrate various SMOI substrates made using techniques of the present disclosure. Referring to FIG. 12A, this figure shows a very basic SMOI structure 1200. At its simplest, SMOI structure 1200 includes a donee layer 1204 and a heteroepitaxial semiconductor layer 1208 formed on the donee layer. Like the electronic structures disclosed above in connection with FIGS. 1-9, donee layer 1204 is formed by cleaving it from a donor 1212, in this case a micaceous/lamellar mass having lamelliform layers compatible with the heteroepitaxial growth of semiconductor layer 1208. It is noted that the lattice constants of micaceous/lamellar materials vary from material to material. Consequently, the selection of the particular material for donor 1212 may be a function of the semiconductor material (elemental, doped, compound, etc., e.g., Si, Ge, SiGe and doped variants, among others) selected for semiconductor layer 1208.

In addition, it is noted that in many cases the lattice constants of the material selected for donor 1212 can be tailored for a particular application by changing the composition of that material. For example, the complex synthetic fluorine silicate mica know as fluorophlogopite ($KMg_3(AlSi_3O_{10})F_2$) has the lattice constants a=5.308 Å, b=9.183 Å and c=10.139 Å. By substituting the fluorine molecule with a hydroxyl molecule, or potassium with sodium, etc., the lattice constants can be readily varied. It is also noted that the crystal lattice of donee layer 1204 may have some compliance in adapting to the lattice structure of the heteroepitaxial semiconductor layer 1208.

Semiconductor layer 1208 may be formed using virtually any heteroepitaxial growth techniques, including seed layer techniques such as zone melting recrystallization and excimer laser annealing. It is also possible that heteroepitaxial layers can be grown on porous silicon. It is therefore conceivable that an underlying seed layer (not shown) of amorphous silicon may be used to grow a base heteroepitaxial layer. Following the formation of this crystalline seed layer, conventional high-speed epitaxy may be used. After semiconductor layer 1208 has been formed, donee layer 1204 may be cleaved from donor 1212 so as to liberate SMOI structure 1200. When donee layer 1204 is a good dielectric, SMOI structure 1200 may be used as an SMOI substrate for fabrication of functional circuitry thereon.

Alternatively, if desired, a portion of semiconductor layer 1208 may be converted into an oxide to form a dielectric layer 1216, or, alternatively, an oxide layer may be formed on the semiconductor layer so as to provide the dielectric layer. Dielectric layer 1216 may function as the insulator of the SMOI. If the desired thickness of dielectric layer 1216 is beyond the practical limits of conventional thermal oxidation and deposited/grown oxide, a dielectric handle may additionally or alternatively be used.

Figure 12B:
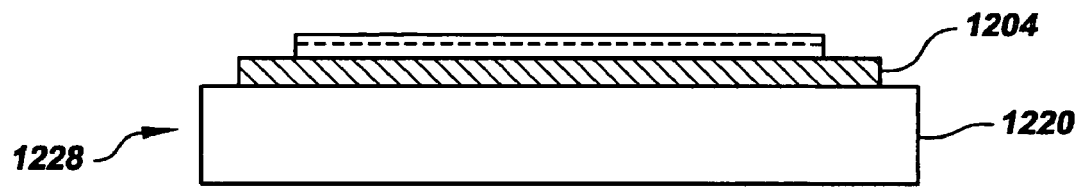
Figure 12C:

As shown in FIGS. 12B-C, if needed a handle 1220 (FIG. 12B), 1224 (FIG. 12C) may be secured to either donee layer 1204 or semiconductor layer 1208 (or dielectric layer 1216, if present). Handles 1220, 1224 may be secured using any suitable techniques, such as the techniques listed in the '240 application incorporated herein by reference above. In FIG. 12B, the combination of SMOI structure 1200 and handle 1220 may serve as an SMOI substrate 1228 for layer fabrication of electrical devices thereon. In FIG. 12C, donee layer 1204 may be removed to expose the crystalline semiconductor material of semiconductor layer 1208. In this case, semiconductor layer 1208, handle 1224 and dielectric layer 1216 (if present) may serve as a SMOI substrate 1232. Donee layer 1204 may be removed by any suitable technique, such as plasma etching, chemical etching, liquid etching, gas etching, laser-assisted etching, grinding, polishing and chemical-mechanical polishing, among others. It is noted that if needed, any of SMOI substrates 1200, 1228, 1232 may be subjected to one or more additional treatments. For example, any of these substrates 1200, 1228, 1232 may be annealed to reduce differential resistance and reduce interfacial traps. Substrate 1232 of FIG. 12C may be thermally annealed and/or subject to temporal treatment (i.e., leaving the assembly for a few days) to strengthen the bond between semiconductor layer 1208 and handle 1224. As those skilled in the art will readily appreciate, in each of the foregoing exemplary SMOI substrates 1200, 1228, 1232 any one or more of the various layers may be transparent to suit the application for that substrate.

Figure 13A:
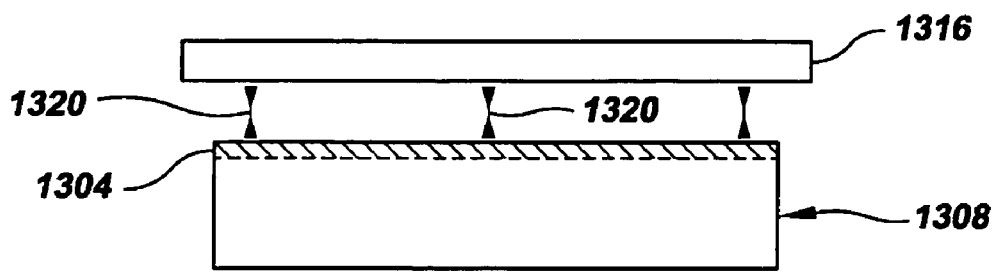
FIGS. 13A-C are cross-sectional views showing an alternative SMOI substrate made using techniques of the present disclosure and illustrating various steps of forming such substrate.
Figure 13B:
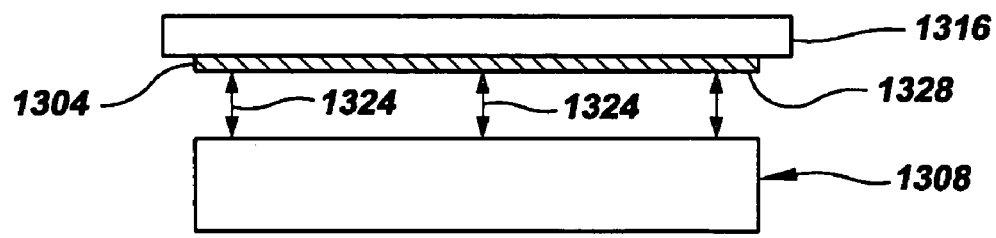
Figure 13C:
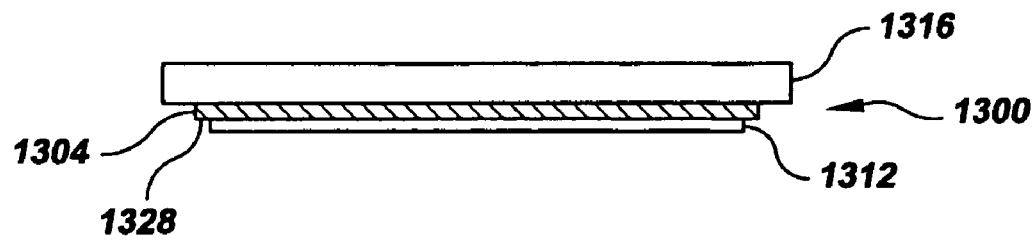

Whereas FIGS. 12A-C illustrated processes in which heteroepitaxial semiconductor layer 1208 was formed prior to cleaving donee layer 1204 from donor 1212, FIGS. 13A-C illustrate a SMOI substrate 1300 (FIG. 13C) in which a donee layer 1304 is cleaved from a donor 1308 (FIGS. 13A-B) prior to forming a semiconductor layer 1312 (FIG. 13C). In this example, at least donee layer 1304 functions as the insulator of the SMOI. In FIG. 13A, donor 1308 of a micaceous/lamellar mass is provided, and a handle 1316 (with or without coatings or binding layers between the donor and the handle) is secured to the donor in any suitable manner, such as a manner described above or in the '240 application. Arrows 1320 indicate the bringing together of handle 1316 and donor 1308 in the attaching process.

Once handle 1316 has been secured to donor 1308, donee layer 1304 may be cleaved from the donor, as indicated in FIG. 13B by arrows 1324. Then, semiconductor layer 1312 may be heteroepitaxially formed on the just-cleaved surface 1328 of the donee layer as shown in FIG. 13C so as to form SMOI substrate 1300. Like other examples, the bonding, cleaving and heteroepitaxy techniques used in forming SMOI substrate may be any suitable for creating a functional end product.

Some notable advantages of forming SMOI substrate 1300 in this manner include: the micaceous/lamellar materials of donee layer 1304 exhibit better thermal spreading ability than amorphous silicon dioxide insulators currently in use; the thermal conductivity of micaceous/lamellar materials is significantly higher than silicon dioxide in the direction of the cleavage plane; the crystalline nature of the donee layer allows for the best bulk dielectric isolation possible and allows for consistent batch-to-batch device performance; the crystalline nature of the donee layer allows for the best radiation-hardened SMOI chip possible; the atomic-level flatness of cleaved surface 1328 of the donee layer allows for a very high quality and flat heteroepitaxial semiconductor layer 1312 (this flatness is very desirable for present and next generation lithography/exposure systems; and very thick insulation, beyond that which is conventionally possible with traditional SOI techniques, can be provided.

Figure 14A:
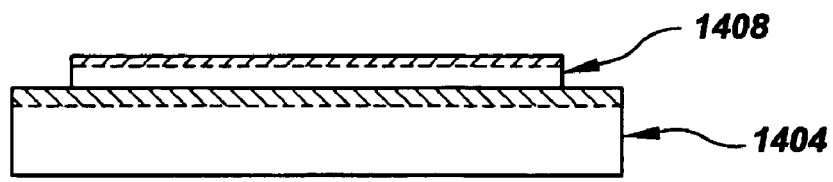
FIGS. 14A-C are cross-sectional views showing another alternative SMOI substrate made using techniques of the present disclosure and illustrating various steps of forming such substrate.
Figure 14B:
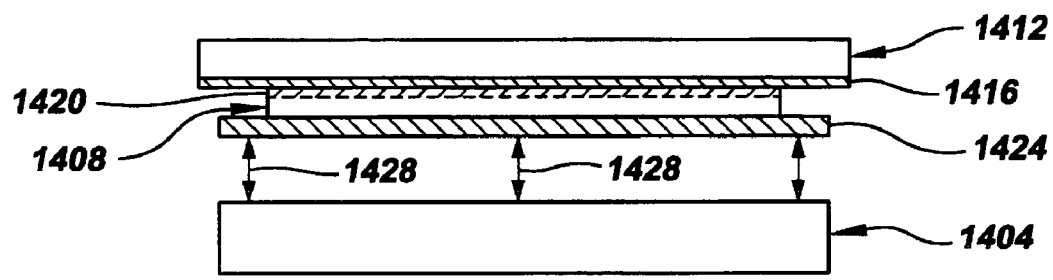
Figure 14C:
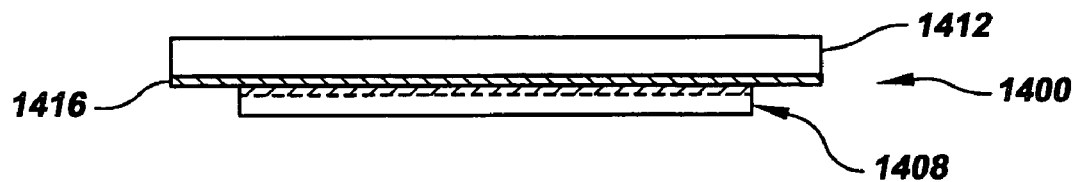

Silicon germanium compound (SiGe) semiconductors are presently of prime interest in developing next-generation electronics. FIGS. 14A-C illustrate the creation of several embodiments of an SiGe-based SMOI substrate 1400 (FIG. 14C) using techniques of the present disclosure. Referring to FIG. 14A, a micaceous/lamellar donor 1404 is provided, and a heteroepitaxial semiconductor layer 1408 is formed on the donor. Semiconductor layer 1408 may be either a full thickness of SiGe or several layers of Si and SiGe. If semiconductor layer 1408 contains just SiGe, a handle 1412 having a surface oxide layer 1416 may be bonded to the semiconductor layer as shown in FIG. 14B. However, if semiconductor layer 1408 contains several layers, e.g., (from proximate donor 1404) SiGe—Si or Si—SiGE—Si, the silicon layer 1420 distal from the donor may be converted in-situ to an oxide to act as an insulator prior to the bonding of handle 1412. In this case, in FIG. 14B, handle 1412 may or may not include surface oxide layer 1416.

After handle 1412 (and surface oxide layer 1416, if provided) is/are secured to semiconductor layer 1408, a donee layer 1424 is cleaved from donor 1404 as depicted by arrows 1428. Then, as shown in FIG. 14C, SMOI substrate 1400, which includes semiconductor layer 1408, handle 1412, surface oxide layer 1416, if present, and the converted silicon oxide layer (not shown) of the silicon layer, may be created by removing donee layer 1424 (FIG. 14B) using any suitable removal technique.

Figure 15A:
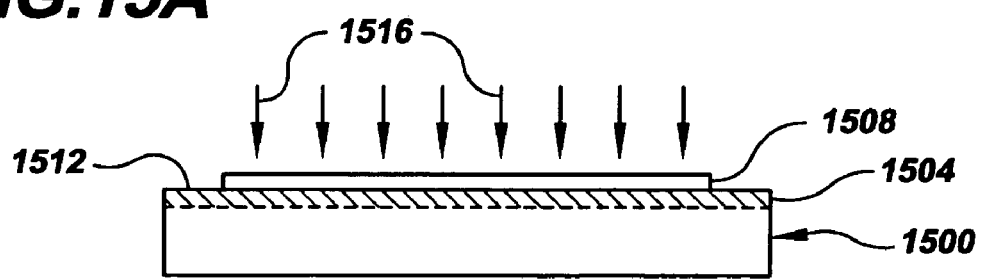
FIGS. 15A-C are cross-sectional views showing yet another alternative SMOI substrate made using techniques of the present disclosure and illustrating various steps of forming such substrate.
Figure 15B:
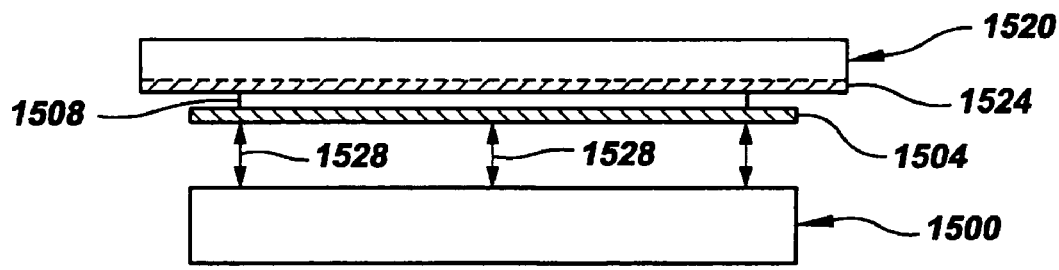
Figure 15C:
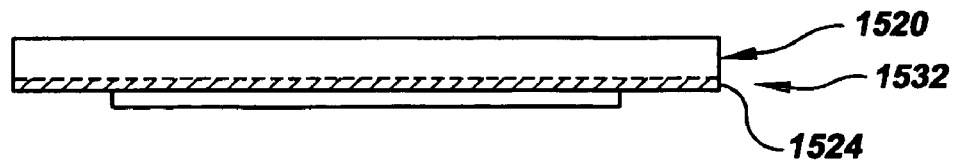

Silicon carbide (SiC) is an invaluable substrate material for fabricating visible light-emitting diodes. SiC is also presently actively being investigated for use in high-temperature electronics, as a next-generation replacement for silicon-based semiconductor circuits and other uses. However, widespread adoption of SiC has been hampered by its high cost and limited availability. FIGS. 15A-C, however, illustrate techniques for forming SiC on insulator, which is an SMOI, and SiC on any material, which is an SMOA.

Referring particularly to FIG. 15A, a micaceous/lamellar donor 1500 that will provide a donee layer 1504 is provided. A heteroepitaxial semiconductor layer 1508 of silicon is formed on the free surface 1512 of donee layer 1504. At least a portion of semiconductor layer 1508 is converted into SiC using known techniques (depicted by arrows 1516). Following the SiC conversion, a handle 1520, which may optionally have a surface oxide layer 1524, is secured to semiconductor layer 1508 as shown in FIG. 15B. Like other examples presented in this disclosure, any suitable attaching technique may be used to secure handle 1520 (and surface oxide layer 1524, if present) to semiconductor layer 1508. Then, donee layer 1504 is cleaved from donor 1500, as indicated by arrows 1528 in FIG. 15B. Then, donee layer 1504 is removed from semiconductor layer 1508 using any suitable removal technique known at the time of removal. The result of removing donee layer 1504 is SMOI/SMOA substrate 1532, which is shown by itself in FIG. 15C. When surface oxide layer 1524 is present, substrate 1532 may be considered an SMOI. The same is true when handle 1520 (without surface oxide layer 1524) is an insulator, which it will typically be. That said, since one embodiment has only semiconductor layer 1508 directly on handle 1520, i.e., without surface oxide layer 1524, and at least theoretically handle 1520 can be virtually any material, this embodiment of substrate 1532 may also be called an SMOA.

In connection with SMOI/SMOA substrate 1532 of FIG. 15C, it is noted that silicon carbide has a significantly higher thermal conductivity than silicon. This is one of the attractive features for its proposed use in next-generation electronics. That said, widespread adoption of silicon carbide would require significant retooling of the processes used in the silicon-based industries. FIGS. 16A-D illustrate the creation of a hybrid Si/SiC substrate 1600 (FIG. 16D) in which a large portion of the silicon infrastructure can be maintained and the high thermal conductivity of silicon carbide can be harnessed in removing heat from semiconductor chips.

Figure 16A:
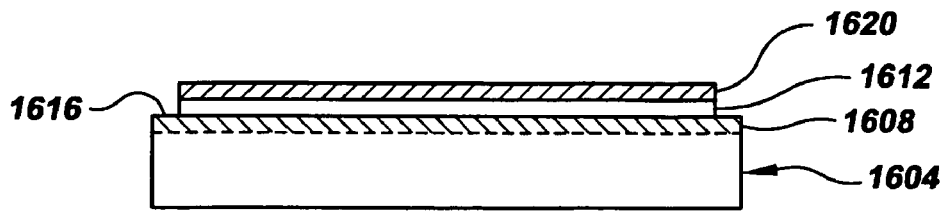
FIGS. 16A-D are cross-sectional views showing a further alternative SMOI substrate made using techniques of the present disclosure and illustrating various steps of forming such substrate.

In FIG. 16A, a micaceous/lamellar donor 1604 having at least one donee layer 1608 is provided. Then, a heteroepitaxial silicon layer 1612 is formed on the free surface 1616 of donor 1604 (and donee layer 1608) to a desired thickness using any suitable technique, such as a conventional technique. Then, a thermal oxide layer 1620 may be formed on silicon layer 1612, again using any suitable technique known at the time of formation.

Figure 16B:
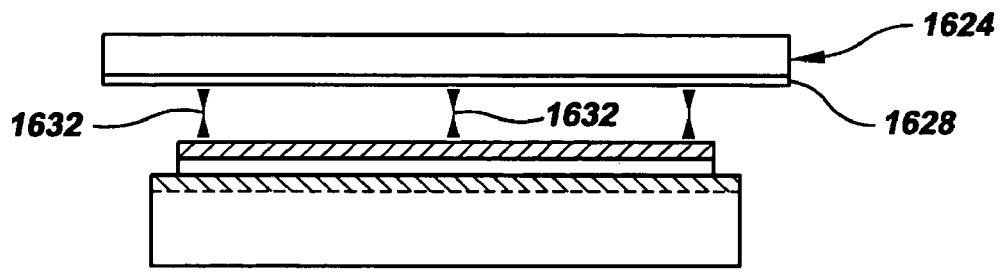

Referring to FIG. 16B, after thermal oxide layer 1620 has been formed, a handle 1624 that includes a silicon carbonate layer 1628 is provided and secured to the thermal oxide layer using any suitable bonding technique known at that time (the bringing together of handle 1624/SiC layer 1628 is illustrated by inverted arrows 1632). In this manner, handle 1624 can be processed so as to include SiC layer 1628 separately from the conventional silicon-based processing.

Figure 16C:
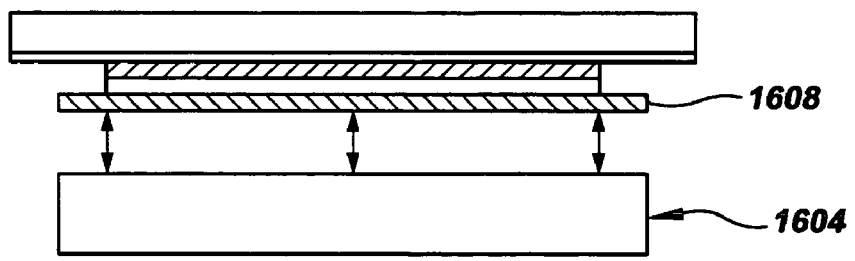

After handle 1624 has been secured to donee layer 1608 via its attachment through SiC layer 1628, thermal oxide layer 1620 and Si layer 1612, then donee layer 1608 may be cleaved from donor 1604 as illustrated in FIG. 16C using any suitable cleaving technique, such as one of the techniques described above and/or in the '240 application, which has been incorporated herein by reference above.

Figure 16D:
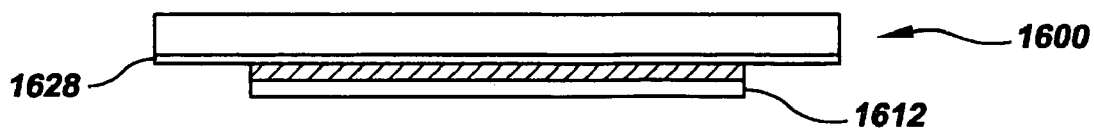

Following cleaving, donee layer 1608 is removed using any suitable removal technique known at the time so as to produce hybrid Si/SiC substrate 1600 of FIG. 16D. Once hybrid Si/SiC substrate 1600 has been created, electrical devices and other structures (not shown) may be fabricated using conventional Si processing techniques and Si layer 1612 as the base layer for such techniques.

It should be evident to those skilled in the art that SiC layer 1628 can be replaced by a diamond or diamond-like layer or even more generally, a layer of metal, nitride, carbide or any material of suitable thermal conductivity. In this example, the primary function of SiC layer 1628, or layer of other material substituted therefor, is to act as a heat sink to conduct thermal energy from the electrical devices subsequently formed on substrate 1600.

Although the invention has been described and illustrated with respect to exemplary embodiments thereof, it should be understood by those skilled in the art that the foregoing and various other changes, omissions and additions may be made therein and thereto, without parting from the spirit and scope of the present invention.

What is claimed is:

1. A method of making an electronic and/or optoelectronic device structure by layer transfer, comprising:
   providing a crystalline donor having a first free surface and a plurality of intrinsic cleavage planes spaced from one another and each substantially parallel to the first surface, wherein the first free surface and a particular one of the plurality of intrinsic cleavage planes defining a first donee layer;
   fabricating a device layer containing at least one device upon the first donee layer so that the at least one device is monolithic with the first donee layer, said at least one device being either one of an electronic type and an optoelectronic type;
   securing a first handle to either the device layer or the first free surface of the first donee layer; and
   cleaving the first donee layer from the crystalline donor along the particular one of the plurality of intrinsic cleavage planes so as to liberate the first donee layer, in combination with the first handle, from the crystalline donor.

2. A method according to claim 1, wherein said cleaving of the first donee layer is performed prior to said fabricating of the device layer and said securing of the first handle includes securing the handle to the free surface of the first donee layer, and said fabricating of the device layer includes fabricating the device layer on a second free surface of the first donee layer defined by the particular one of the plurality of cleavage planes.

3. A method according to claim 1, wherein said cleaving of the first donee layer is performed after said fabricating of the device layer and said fabricating of the device layer includes fabricating the device layer on the first free surface of the donee layer and said securing of the first handle includes securing the first handle to the device layer.

4. A method according to claim 1, wherein said fabricating of the device layer includes forming an amorphous layer on the first donee layer.

5. A method according to claim 1, wherein said fabricating of the device layer includes forming a polycrystalline layer on the first donee layer.

6. A method according to claim 1, wherein said fabricating of the device layer includes forming a single crystal layer on the first donee layer.

7. A method according to claim 1, wherein said securing of the first handle includes securing an elongate handle to either the device layer or the first free surface of the first donee layer in a roll-to-roll process.

8. A method according to claim 7, wherein said cleaving of the first donee layer is performed in the roll-to-roll process.

9. A method according to claim 8, wherein said fabricating of the device layer is performed in the roll-to-roll process.

10. A method according to claim 1, wherein said fabricating of the device layer includes fabricating at least one transistor.

11. A method according to claim 10, wherein said fabricating of the device layer includes forming at least one thin film transistor.

12. A method according to claim 10, wherein said fabricating of the device layer includes forming at least one thick film transistor.

13. A method according to claim 1, wherein said fabricating of the device layer includes forming at least one electroluminescent device.

14. A method according to claim 1, wherein said fabricating of the device layer includes forming at least one of 1) a sensor and 2) a detector.

15. A method according to claim 1, wherein said providing of the crystalline donor, said fabricating of the device layer, said securing of the handle, and said cleaving of the first donee layer are used to form a first device component, the method further comprising:
   providing a second device component comprising a second device layer and a second handle fixed relative to the second device layer; and
   laminating the first and second device components with one another.

16. A method according to claim 1, further comprising, following said cleaving of the first donee layer, removing substantially all of the first donee layer from the electronic and/or optoelectronic device structure.

17. A method according to claim 1, wherein said providing of the crystalline donor includes providing a micaceous/lamellar donor comprising a plurality of lamelliform sheets, the first donee layer being at least one of the plurality of lamelliform sheets.

18. A method according to claim 17, wherein said providing of the micaceous/lamellar donor includes providing a micaceous/lamellar donor comprising a plurality of fluorophlogopite sheets.

19. A method of manufacturing a plurality of electronic and/or optoelectronic device structures, comprising:
   providing a crystalline donor having a plurality of intrinsic cleavage planes defining a plurality of donee layers;
   forming a device layer on each of the plurality of donee layers, the device layer including at least one of 1) an electronic device and 2) an optoelectronic device; and
   cleaving each of the plurality of donee layers from the crystalline donor along a corresponding one of the plurality of intrinsic cleavage planes in succession with one another so as to liberate that one of the plurality of donee layers from the crystalline donor.

20. A method according to claim 19, wherein said providing of the crystalline donor includes providing a micaceous/lamellar donor having a plurality of lamelliform sheets corresponding respectively to the plurality of donee layers.

21. A method according to claim 20, wherein said providing of the crystalline donor includes providing a unitary mass of fluorophlogopite sheets.

22. A method according to claim 19, further comprising affixing each of the plurality of donee layers to an elongate handle prior to that one of the plurality of donee layers being cleaved from said crystalline donor.

23. A method according to claim 22, wherein said cleaving of each of the plurality of donee layers includes cleaving each of the plurality of donee layers successively in a roll-to-roll process.

24. A method according to claim 23, wherein said forming of the device layer on each of the plurality of donee layers includes forming the device layer in the roll-to-roll process.

25. A method according to claim 22, wherein said affixing each of the plurality of donee layers to the elongate handle is performed after said forming of the device layer of a corresponding respective one of the plurality of donee layers.

26. A method of making an electronic and/or optoelectronic device by layer transfer, comprising:
   fabricating a first device component by:
      providing a crystalline donor having a first free surface and a plurality of intrinsic cleavage planes spaced from one another and each substantially parallel to the first surface, wherein the first free surface and a particular one of the plurality of intrinsic cleavage planes defining a first donee layer;

fabricating a first device layer containing at least one device upon the first donee layer so that said at least one device is monolithic with the first donee layer, said at least one device being either one of an electronic type and an optoelectronic type;

securing a first handle to either the device layer or the first free surface of the first donee layer; and cleaving the first donee layer from the crystalline donor along the particular one of the plurality of intrinsic cleavage planes so as to liberate the first donee layer, in combination with the first handle, from the crystalline donor;

providing a second device component comprising a second device layer and a second handle fixed relative to the second device layer; and laminating the first and second device components with one another.

27. A method according to claim 26, wherein said laminating of the first and second device components includes laminating the first and second device components with one another so that free surfaces of the first and second device layers face one another.

28. A method according to claim 26, wherein said laminating of the first and second device components includes laminating the first and second device components with one another so that free surfaces of the first and second device layers face away from one another.

29. A method according to claim 26, wherein said laminating of the first and second device components with one another forms a three-dimensional stacked electronic circuit.

30. A method according to claim 29, wherein said laminating of the first and second device components with one another forms a three-dimensional stacked integrated electronic circuit.

31. A method according to claim 30, wherein said laminating of the first and second device components with one another forms a three-dimensional stacked memory circuit.

32. A method according to claim 26, wherein said laminating of the first and second device components with one another forms a three-dimensional stacked opto-electronic circuit.

33. A method according to claim 26, wherein said laminating of the first and second device components with one another forms a three-dimensional stacked sensor circuit.

* * * * *